United States Patent [19]

Marinelli

[11] 4,029,531
[45] June 14, 1977

[54] METHOD OF FORMING GROOVES IN THE [0$\bar{1}$1] CRYSTALLINE DIRECTION

[75] Inventor: Donald Paul Marinelli, Trenton, N.J.

[73] Assignee: RCA Corporation, New York, N.Y.

[22] Filed: Mar. 29, 1976

[21] Appl. No.: 671,555

[52] U.S. Cl. .............................. 156/647; 29/580; 29/583; 51/283; 156/645; 156/659

[51] Int. Cl.$^2$ .................................. H01L 21/312

[58] Field of Search ............... 156/3, 6, 7, 8, 17; 29/580, 583; 51/283

[56] References Cited

UNITED STATES PATENTS

| | | | |
|---|---|---|---|
| 3,486,892 | 12/1969 | Rosuold | 156/17 |
| 3,765,969 | 10/1973 | Kragness et al. | 156/17 |
| 3,920,495 | 11/1975 | Roberts | 252/79.3 |
| 3,959,037 | 5/1976 | Gutierrez et al. | 156/17 |

OTHER PUBLICATIONS

Tarui et al., Yasuo, "Preferential Etching and Etched Profile of GaAs," *Journal of Electrochemical Society: Solid State Science*, Jan. 1971, pp. 118–122.

*Primary Examiner*—Charles E. Van Horn
*Assistant Examiner*—Jerome W. Massie
*Attorney, Agent, or Firm*—Glenn H. Bruestle; Daniel N. Calder

[57] ABSTRACT

An A-B etchant is applied to a (100) surface of a body of semiconductor material, a portion of which along the (100) surface of the body is either gallium arsenide or gallium aluminum arsenide. The etchant is applied for at least 15 seconds at a temperature of approximately 80° C. The A-B etchant is a solution by weight percent of 47.5%, water, 0.2% silver nitrate, 23.8% chromium trioxide and 28.5% of a 48% aqueous solution of hydrofluoric acid. As a result of the application of the A-B etchant a pattern of elongated etch pits form having their longitudinal axes along the [0$\bar{1}$1] crystalline direction. Grooves are formed in the body at a surface opposite the (100) surface on which was applied the etchant. The grooves are formed along the [0$\bar{1}$1] crystalline direction by aligning the longitudinal axes of the grooves with the longitudinal axes of the etch pits.

7 Claims, 6 Drawing Figures

METHOD OF FORMING GROOVES IN THE [0$\bar{1}$1] CRYSTALLINE DIRECTION

BACKGROUND OF THE INVENTION

This invention herein described was made in the performance of work under a NASA contact and is subject to the provisions of section 305 of the National Aeronautics and Space Act of 1958, Public Law 85-568 (72 Stat. 435; 42 U.S.C. 2457).

The present invention relates to a method of forming grooves in a body of semiconductor material and more specifically to forming grooves in the [0$\bar{1}$1] crystalline direction.

During the fabrication of stripe configuration semiconductor devices, such as mesa and buried structure configurations, photoresist is applied to the surface of a semiconductor body and then patterned by well known photolithographic techniques. Typically, in the fabrication of a mesa structure for example, the photoresist pattern is of such a design as to facilitate in the etching of two parallel grooves thereby forming in the mesa structure therebetween. After the forming of the mesa structure by the etching of grooves, an insulation layer, such as silicon dioxide, is deposited on the mesa structure, in the grooves and on the exposed surface of the body. A portion of the insulation layer, i.e. usually on the top of the mesa structure, is removed by etching. A contact layer, typically a metal, is then deposited on the insulation layer and the top surface of the mesa. The insulation layer electrically insulates a portion of the mesa structure, the grooves and the remaining body surface from the contact layer. Thus, if the insulation layer is not continuously and uniformly deposited the contact layer may come in contact with the semiconductor body or mesa structure thereby shorting out the device.

The depositing of a continuous and uniform insulation layer in the grooves is more readily accomplished if the sides of the grooves flair-toward each other from the top of the grooves to the bottom of the grooves, rather than being perpendicular or flairing-away from each other from the top of the grooves toward the bottom of the grooves. In the latter two cases the sides of the grooves tend to be partially obstructing to the deposition of the insulation layer. For semiconductor bodies, having a portion of which is gallium or gallium aluminum arsenide, when grooves are formed in a (100) surface of the body along the [0$\bar{1}$1] crystalline direction, the sides of the grooves will flair-toward each other. Thus, it would be most desirable in the fabrication of stripe configuration semiconductor devices to be able to determine this crystalline direction prior to the forming of grooves for the formation of mesa or buried structures.

SUMMARY OF THE INVENTION

A method of forming grooves along the [0$\bar{1}$1] crystalline direction of a body of semiconductor material a portion of which along a (100) surface of the body is gallium arsenide or gallium aluminum arsenide. The method includes applying to the (100) surface for at least 15 seconds at a temperature on the order of 80° C., an etchant which is a solution by weight percent of 47.5% water, H$_2$O, 0.2% silver nitrate, AgNO$_3$, 23.8% chromium trioxide, CrO$_3$, and 28.5% of a 48% aqueous solution of hydrofluoric acid, HF. The etchant forms a pattern of elongated etch pits whose longitudinal axes are in the [0$\bar{1}$1] crystalline direction. Grooves are formed in the body at a surface opposite the surface on which the etchant is applied. The grooves are aligned with the longitudinal axes of the etch pits so that the grooves are formed along the [0$\bar{1}$1] crystalline direction.

DETAILED DESCRIPTION OF THE INVENTION

Figure 1:
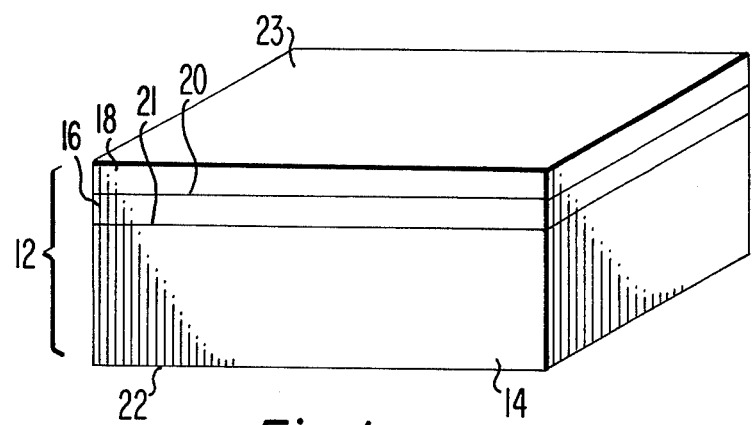
FIG. 1 is a perspective view of a semiconductor body on which is utilized the method of the present invention.
Figure 6:
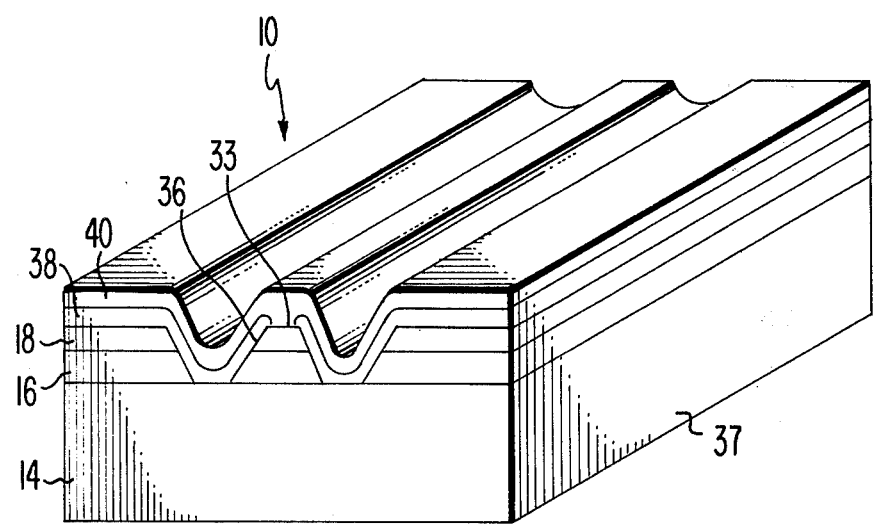

Referring to FIG. 1, a semiconductor body designated as 12 is shown for the purpose of describing the method of the present invention. The body 12 is ultimately fashioned into a strip configuration semiconductor device 10, shown in FIG. 6. For the purpose of explaining the method of the present invention the device 10 is designated as a laser. A laser is a device which emits light either visible or not visible, through the recombination of pairs of oppositely charged carriers.

For the purpose of describing the present invention the semiconductor body 12 includes a substrate 14 of one conductivity type having two opposite surfaces 21 and 22 with surface 22 being a (100) surface. A first layer 16 of the same conductivity type as the substrate 14 is on the surface 21. A second layer 18 of the opposite conductivity type is on a surface of the first layer 16 opposite the substrate 14 having a P-N junction 20 therebetween. The second layer 18 has a surface 23 opposite the first layer 16. The surface 23 is a (100) surface. If the substrate 14 and first layer 16 are on N type conductivity, the second layer 18 is of P type conductivity, although the conductivities of the substrate 14 and layers 16 and 18 can be opposite of that described.

The substrate 14 is of gallium arsenide and the first and second layers are of III–V semiconductor materials. For the purpose of explaining the method of the present invention, the first and second layers 16 and 18 are epitaxially grown layers of gallium arsenide.

If a groove is formed into the first and second layers 16 and 18 at the surface 23, along the [0$\bar{1}$1] crystalline direction, the sides of the groove will flair-toward each other from the top of the groove to the bottom of the groove. As previously explained, grooves with sides that flair-toward each other make possible a continuous and uniform layer of material desposited thereon. It is well known to those in the semiconductor art that the [0$\bar{1}$1] crystalline direction is the direction normal to the [0$\bar{1}$1] plane.

In order to determine the [0$\bar{1}$1] crystalline direction an etchant hereinafter referred to as the A–B etchant, is applied to the surface 22 of the body 12. The A–B etchant is a solution by weight percent of 47.5% water (H$_2$O), 0.2% silver nitrate (AgNO$_3$), 23.8% chromium trioxide (CrO$_3$), and 28.5% of a 48% aqueous solution of hydrofluoric acid (HF). The components of this solution should be added in the order listed. For the practice of the present invention the surface 2 may be in a lapped condition rather than in a polished condition when the A–B etchant is applied.

Figure 2:
FIG. 2 is a microphotograph of the etch pit pattern formed in the method of the present invention.

If the A–B etchant is applied to the surface 22 for at least about 15 seconds, preferably for 30 seconds, at a temperature of approximately 80° C., a pattern of oriented and alongated ethc pits 30 appear as shown in FIG. 2. The elongated or longitudinal axis A—A of the etch pits 30 indicate the [0$\bar{1}$1] direction of the substrate 14.

It is also well known to those in the semiconductor art that semiconductor layers epitaxially grown on a semiconductor substrate will have the same crystalline orientation as the semiconductor substrate. Therefore, the longitudinal axis A—A of the etch pits 30 will also indicate the [0$\bar{1}$1] direction of the first and second layers 16 and 18.

A side of the body 12 is then cleaved parallel to the [0$\bar{1}$1] crystalline direction forming reference side 37. Reference side 37 is therefore a reference plane so that the [0$\bar{1}$1] direction can be easily transferred from the surface 22 to the opposite surface of the body 12. In a body of either gallium arsenide or gallium aluminum arsenide or in a body having the crystallographics of either of these materials the [0$\bar{1}$1] plane is a natural cleavage plane parallel to the [0$\bar{1}$1] crystalline direction.

Figure 3:
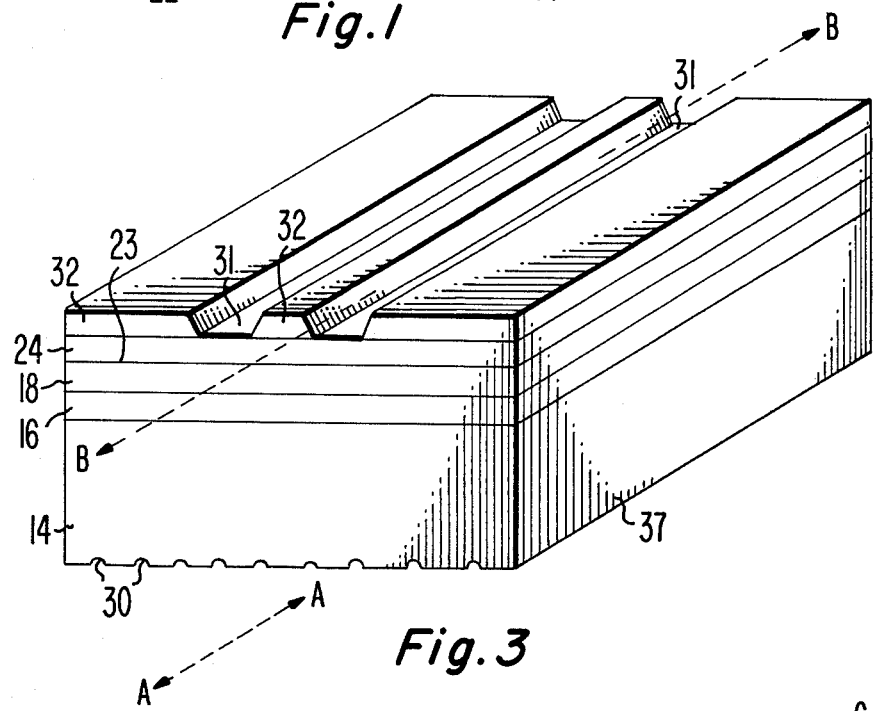
FIGS. 3 to 6 are perspective views of the semiconductor body of FIG. 1 at various steps in the fabrication of a semiconductor device in which the method of the present invention is utilized.

Referring to FIG. 3, after the [0$\bar{1}$1] crystalline direction is determined, a layer 24 of silicon dioxide is deposited on the surface 23, by techniques well known to those in the art, such as evaporation. Next, a layer 32 of a photosensitive material such as Waycoat I.C. Resist 28CP Type 3 by Phillip A. Hunt Chemical Corp. of Palisades, N.J. is deposited on a surface of the layer 24. Using photolithographic techniques well known in the art, grooves 31 are formed into the photoresist layer 32, thereby forming a photoresist mask. In order to practice the method of the present invention, the grooves 31 are formed along the [0$\bar{1}$1] crystalline direction, i.e. the longitudinal axis B—B of the grooves 31 are aligned with the longitudinal axis A—A of the etch pits 30 by aligning the grooves 31 with the reference side 37 of body 12. An acid to which the photoresist maske 32 has been rendered insoluble, such as buffer-HF, is then applied to the photoresist mask 32 and in the grooves 31. The acid etches grooves into that portion of layer 24 exposed by grooves 31. The etched grooves extend through layer 24 to the surface 23. The photoresist mask 32 is then removed.

Figure 4:
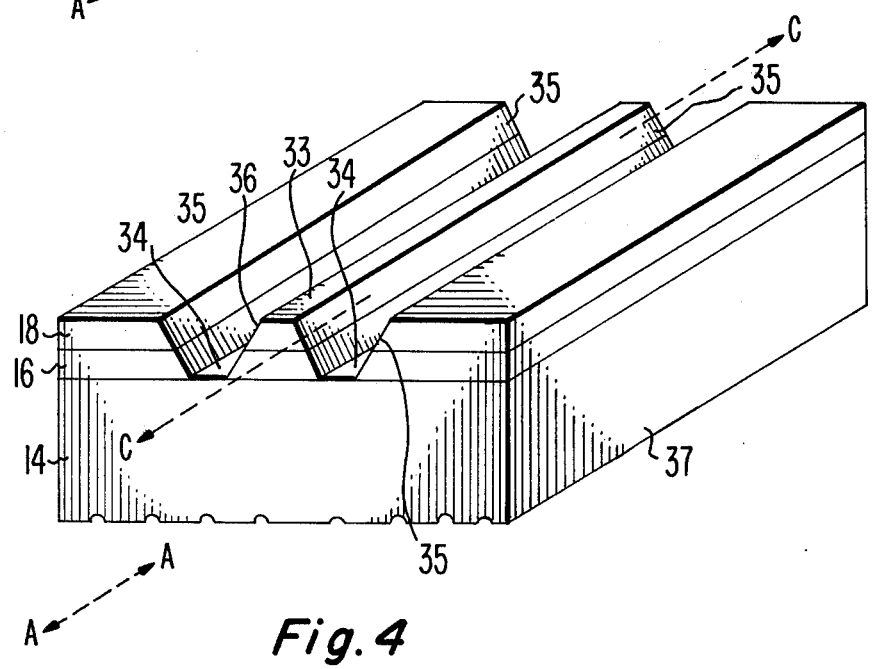

Referring to FIG. 4, an acid to which the layer 24 is impervious, such as a solution of six parts sulphuric acid, one part hydrogen peroxide and one part water, is applied to the layer 24 and to the exposed portion of surface 23 thereby etching grooves 34 into the first and second layers 16 and 18 and forming the mesa configuration 36. From the description of device 10 fabrication so far detailed it is obvious that the grooves 34 are formed along the [0$\bar{1}$1] direction, i.e. the longitudinal axis C—C of the grooves 34 are aligned with the longitudinal axis A—A of the etch pits 30. The mesa 36 has a top surface 33. The remaining portion of the layer 24 is then removed by etching.

As a result of etching the grooves 34 in the [0$\bar{1}$1] crystalline direction, the grooves 34 have sides 35 which flair-toward each other from the top of the grooves to the bottom of the grooves.

Figure 5:
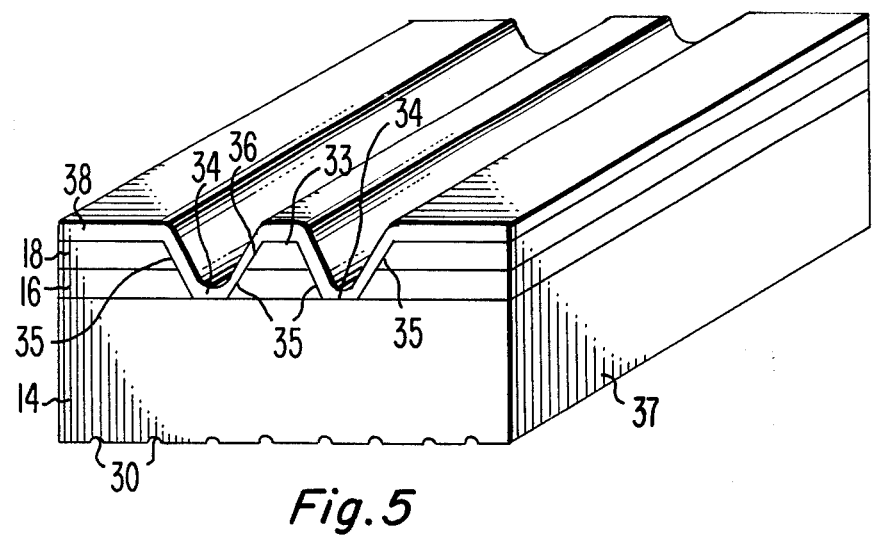

Next, an insulating film 38 is deposited by well known techniques, such as vapor depostion, on the mesa configuration 36 and in the grooves 34, FIG. 5. Typically, the insulating film 38 is of a material such as silicon dioxide and is about 1000A in thickness. Because the grooves 34 have sides 35 which flair-toward each other the insulating film 38 can be deposited in a continuous and uniform film. If the sides 35 of the grooves 34 were instead perpendicular or flairing-away from each other they would obstruct the continuous and uniform deposition of the insulating film 38, and could cause unwanted gaps in the insulating film 38.

A portion of the insulating film 38 on the top surface 33 of the mesa 36 is then removed by well known photolithographic techniques. Subsequently, a metallic film 40 is deposited on the insulating film 38 and top surface 33 of the mesa configuration 36, shown in FIG. 6. If the metallic film 40 were also deposited into an unwanted gap in the insulating film 38, when electrical power is applied to the device 10 an electrical short can result destroying the device 10.

The surface 22 is then lapped off so as to remove the etch pits 30.

While the method of the present invention has been described in the fabrication of a semiconductor laser, it is anticipated that the present invention can be utilized in the fabrication of striped configuration semiconductor devices.

The semiconductor body as described includes a substrate of gallium arsenide with two layers of III–V materials epitaxially and sequentially deposited thereon. However, the method of the present invention can be utilized on a semiconductor body a portion of which is either gallium arsenide or gallium aluminum arsenide along a (100) surface of the body, e.g. the body can be only gallium arsenide or gallium aluminum arsenide or the body can have a portion of which is gallium arsenide or gallium aluminum arsenide along a (100) surface of the body with one or more epitaxial layers of III–V materials sequentially deposited thereon.

The method of the present invention provides grooves having sides which flair-toward each other, in the fabrication of striped configuration semiconductor devices.

I claim:

1. A method of forming groove along the [0$\bar{1}$1] crystalline direction of a body of semiconductor material a portion of which is gallium arsenide or gallium aluminum arsenide along a (100) surface of said body, comprising the steps of:

applying to the (100) surface an etchant for at least 15 seconds at a temperature on the order of 80° C., said etchant being a solution by weight percent of 47.5% water, $H_2O$, 0.2% silver nitrate, $AgNO_3$, 23.8% of chromium trioxide, $CrO_3$, 28.5% of a 48% aqueous solution of hydrofluoric acid, HF, said etchant forming a pattern of elongated etch pits whose longitudinal axes are in the [0$\bar{1}$1] crystalline direction; and forming grooves in said body at a surface opposite said surface on which said etchant is applied with said grooves being aligned with the longitudinal axes of said etch pits so that said grooves are formed along the [0$\bar{1}$1] crystalline direction.

2. The method of forming grooves in accordance with claim 1 wherein said surface on which said etchant is applied is in a lapped condition when said etchant is applied.

3. The method of forming grooves in accordance with claim 2 wherein said etchant is applied to said [100] surface for approximately 30 seconds.

4. The method of forming grooves in accordance with claim 3 wherein a side surface of said body is cleaved parallel to said longitudinal axes of said etch pits thereby forming a reference surface for determining the [0$\bar{1}$1] crystalline direction on said opposite surface.

5. The method of forming grooves in accordance with claim 4 wherein said body is gallium arsenide.

6. The method of forming grooves in accordance with claim 4 wherein said body is gallium aluminum arsenide.

7. The method of forming grooves in accordance with claim 4 wherein said body has a substrate of gallium arsenide along a (100) surface of said body with one or more layers of III–V semiconductor materials epitaxially and sequentially deposited thereon.

* * * * *

UNITED STATES PATENT OFFICE
CERTIFICATE OF CORRECTION

PATENT NO. : 4,029,531

DATED : June 14, 1977

INVENTOR(S) : Donald P. Marinelli

It is certified that error appears in the above-identified patent and that said Letters Patent are hereby corrected as shown below:

| | |
|---|---|
| Col. 1, line 22 | after "forming" delete "in"; |
| Col. 1, line 47 | after "gallium" second occurrence insert -- arsenide --; |
| Col. 2, line 23 | "strip" should be -- stripe --; |
| Col. 2, line 40 | "on" should be -- of --; |
| Col. 2, line 56 | "desposited" should be -- deposited --; |
| Col. 2, line 68 | after "surface" "2" should be -- 22 --; |
| Col. 3, line 6 | "ethc" should be -- etch --; |
| Col. 3, line 21 | after "surface" and before "of" insert -- 23 --; |
| Col. 3, line 43 | "maske" should be -- mask --; |
| Col. 3, line 67 | "depostion" should be -- deposition--; |
| Claim 1, line 44 | "groove" should be -- grooves --; |

UNITED STATES PATENT OFFICE
CERTIFICATE OF CORRECTION

Patent No. 4,029,531            Dated June 14, 1977

Inventor(s) Donald P. Marinelli

It is certified that error appears in the above-identified patent and that said Letters Patent are hereby corrected as shown below:

Claim 3, line 68, " [100]" should read -- (100) --.

Signed and Sealed this

Fourth Day of October 1977

[SEAL]

Attest:

RUTH C. MASON
*Attesting Officer*

LUTRELLE F. PARKER
*Acting Commissioner of Patents and Trademarks*